United States Patent [19]

Splatt

[11] 4,021,683
[45] May 3, 1977

[54] ELECTRONIC SWITCHING CIRCUITS

[75] Inventor: Reginald John Kingston Splatt, Farnham, England

[73] Assignee: National Research Development Corporation, London, England

[22] Filed: Dec. 31, 1975

[21] Appl. No.: 645,617

[30] Foreign Application Priority Data

Jan. 3, 1975 United Kingdom ............... 320/75
June 23, 1975 United Kingdom ............ 26623/75

[52] U.S. Cl. .................... 307/252 UA; 307/252 T; 307/311
[51] Int. Cl.² .................. H03K 17/60; H03K 17/78
[58] Field of Search ... 307/252 T, 252 UA, 252 W, 307/311; 323/25, 18, 21

[56] References Cited

UNITED STATES PATENTS

| | | | |
|---|---|---|---|
| 3,723,769 | 3/1973 | Collins | 307/252 UA |
| 3,766,409 | 10/1973 | Shuey | 323/18 |
| 3,816,763 | 6/1974 | Korn et al. | 307/252 UA |

OTHER PUBLICATIONS

"Optocoupler is Zero Crossing Detector and Isolator in Triac Power Control" Electronic Design 9/20/75 p. 104.

Primary Examiner—Stanley D. Miller, Jr.
Assistant Examiner—B. P. Davis
Attorney, Agent, or Firm—Cushman, Darby & Cushman

[57] ABSTRACT

An electronic switching circuit for controlling the supply of alternating current to a load, comprising a bi-directional rectifier combination having first and second trigger electrodes; first and second direct current trigger voltage supplies of equal voltage but electrically isolated from each other; a first switchable semiconductor device connected in series between the first direct current trigger voltage supply and the first trigger electrode of the bi-directional rectifier combination; a second switchable semiconductor device connected in series between the second direct current trigger voltage supply and the second trigger electrode of the bi-directional rectifier combination; and control means for rendering the switchable semiconductor devices conductive from the next zero-voltage instant of the alternating current supply after the onset of a control signal. The control means may include a full-wave rectifier combination, a third switchable semiconductor device connected to receive a control signal on one input and the unsmoothed output waveform of the full-wave rectifier circuit on another input so that it will conduct only when the control signal is on and the rectifier output is substantially at zero voltage; and means for rendering the first and second switchable semiconductor devices conductive when the third switchable semiconductor device conducts. An optional additional circuit may be arranged to inhibit the control signal if the voltage of the full-wave rectifier circuit exceeds a threshold while the supply is switched on.

6 Claims, 2 Drawing Figures

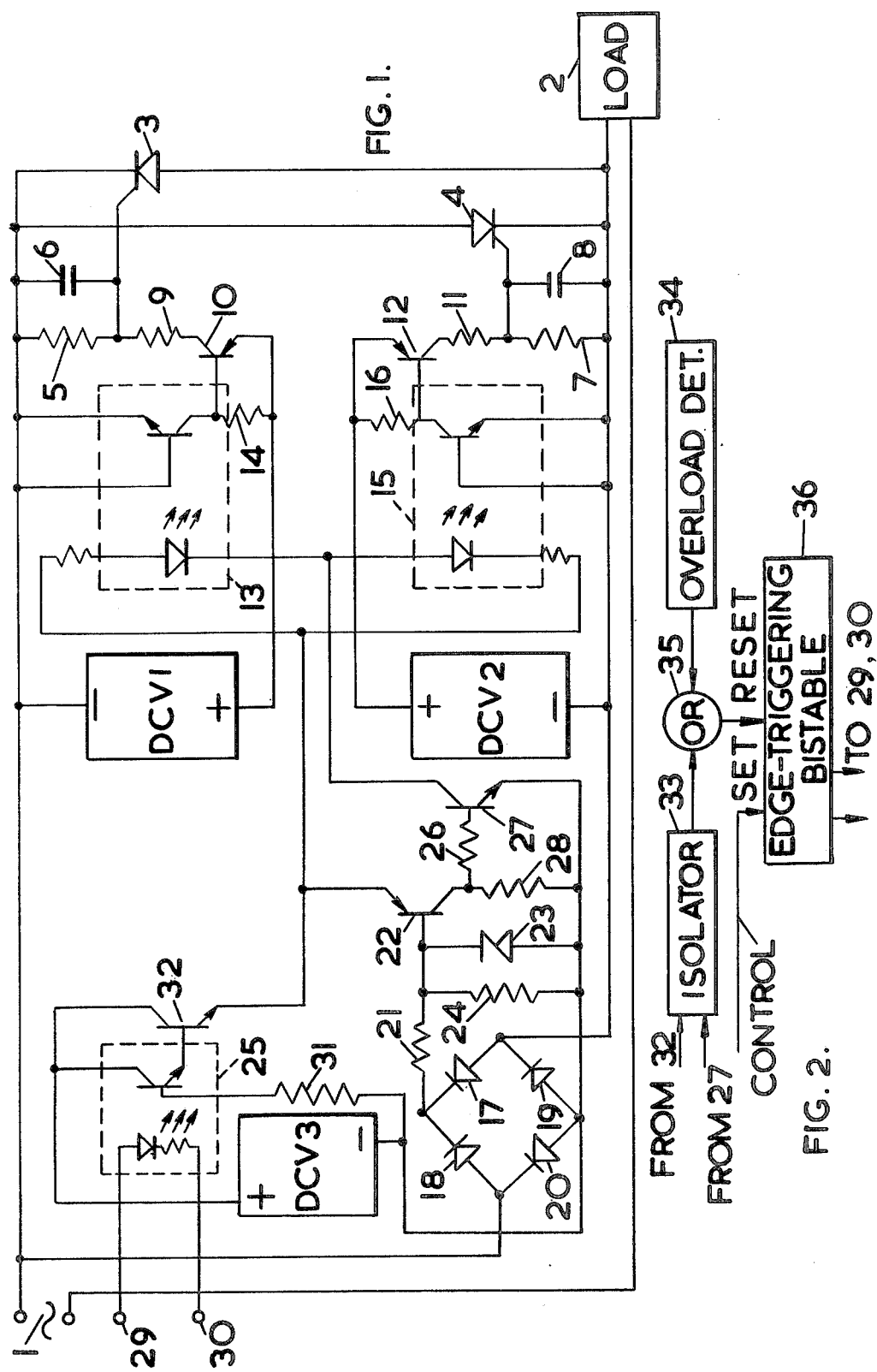

ELECTRONIC SWITCHING CIRCUITS

The present invention relates to solid-state electronic switching circuits for controlling alternating power supplies.

U.K. Pat. No. 1,388,437 and the corresponding U.S. Pat. No. 3,881,118, filed by the same inventor, described solid-state electronic switching circuits for controlling alternating power supplies which have the advantage that they will operate correctly and smoothly even when used to control supplies to highly inductive or highly capacitive loads. These circuits comprise a bi-directional rectifier combination; a bridge rectifier circuit; two resistors each of which is connected between a separate one of the input terminals of the bridge rectifier circuit and a separate one of the main terminals of the bi-directional rectifier combination; at least one connection from an input terminal of the bridge rectifier circuit to a trigger electrode of the bi-directional rectifier combination; a switchable semiconductor device having a control current path and a main current path which may be switched to a conductive state by drawing current through the control current path, the main current path being connected across the output terminals of the bridge rectifier circuit; and a control circuit comprising a direct voltage source, a transistor whose emitter-to-collector current path is connected in series with the said control current path and whose base is connected to receive a full-wave rectified waveform from the bridge rectifier circuit, and first control means for applying a direct voltage from said source to the emitter of the said transistor to cause it to become conductive whenever the said full-wave rectified waveform approaches zero voltage and then to maintain a continuous current in the said control current path until the first control means is reset.

The bi-directional rectifier combination may be a triac, having only one trigger electrode which is connected to one input terminal of the bridge rectifier circuit, or alternatively, the bi-directional rectifier combination may be a pair of thyristors connected in parallel with opposite polarities. In this case, each thyristor will have a trigger electrode connected to a separate one of the input terminals of the bridge rectifier circuit, and each of the said resistors should preferably have a diode connected in parallel with it.

This form of control circuit ensures that any initial switching-on action of the switching circuit will be delayed by a fraction of a cycle if required, to ensure that the initial switching-on will occur when the alternating supply voltage is substantially zero. Thereafter the conducting thyristor (or the conducting current path of the triac) will cease to conduct when the load current falls to zero, but this will allow the voltage to rise across the resistors and the bridge circuit so that the other thyristor or the complementary current path of the triac will be triggered by the rising voltage drop across the associated resistor.

The circuits of U.K. Pat. No. 1,388,437 and U.S. Pat. No. 3,881,118 are reliable and may be considered entirely adequate for many installations; however they tend to produce some high-frequency transients which may be unacceptable in some critical applications where any transients may damage or interfere with the operation of sensitive equipment.

It is an object of the present invention to provide electronic switching circuits which can control alternating power supplies to various loads with reduced high-frequency transients.

According to the present invention there is provided an electronic switching circuit for controlling a supply of alternating current electricity to a load, comprising:

A bi-directional rectifier combination having first and second trigger electrodes;

first and second direct current trigger voltage supplies of equal magnitude and polarity but electrically isolated from each other;

a first switchable semiconductive device connected in series between the first direct current trigger voltage supply and the first trigger electrode of the bi-directional rectifier combination;

a second switchable semiconductor device connected in series between the second direct current to the voltage supply and the second trigger electrode of the bi-directional rectifier combination;

and control means for rendering both the said first and the said second switchable semiconductor devices conductive simultaneously from the next zero voltage instant of the alternating current supply after the onset of a control signal.

The first and second switchable semiconductor devices may be phototransistors of first and second opto-electronic isolator devices respectively. Alternatively they may be first and second transistors controlled by first and second opto-electronic isolator devices respectively. The control means preferably includes a full-wave rectifier circuit connected in parallel with the bi-directional rectifier combination, a third switchable semiconductor device connected to receive a control signal on one input and the unsmooth output wave form on the full-wave rectifier circuit on another input so that it will conduct only when the control signal is on and the rectifier output is substantially at zero voltage; and means for rendering the said first and second switchable semiconductor devices conducted in response to the conduction of the third switchable semiconductor device. The control signal may be a voltage from a third direct voltage supply applied to the third switchable semiconductor device under the control of a third opto-electronic isolator.

In this circuit, when the switchable direct current voltage supply is applied to the third switchable semiconductor device it will become conductive only when the output of the bridge rectifier circuit next falls to zero volts. When conducting the third switchable semiconductor device casuses the first and second switchable semiconductor devices to apply the first and the second direct current trigger voltages to the trigger inputs of the main thyristors. The thyristor whose anode is receiving a rising voltage from the alternating supply will then become conductive. When either of the main thyristors conducts, it short-circuits the full-wave rectifier circuit so that its unsmooth output waveform is reduced to a very low amplitude, thus allowing the control signal to keep the third switchable semiconductor device conductive and thereby maintaining the trigger voltages applied to the thyristors from the first and second direct voltage supplies through the first and second switchable semiconductor devices. Hence the main thyristors will conduct alternate half cycles of the supply in sequence, each becoming non-conductive when its current falls to zero and thereby causing the other thyristor to become conductive immediately with a current rising from zero in the opposite direction.

It will be noted that the main differences between this circuit and the prior circuits of U.K. Pat. No. 1,388,437 and U.S. Pat. No. 3,881,118 lie in the means for deriving the trigger voltages. In the prior circuits, it took a very short but significant time at the commencement of each half-cycle for the rising voltage across the resistors to reach the trigger voltage threshold level before the thyristor started conducting. These slight delays made a negligible difference to the load current waveform, but caused high-frequency transients which would be unacceptable in many applications. In the present circuit the continuous application of trigger voltages from separate supplies avoids this trouble.

Embodiments of the invention will now be described, by way of example only, with reference to the accompanying drawings of which:

FIG. 1 is a circuit diagram of an electronic switching circuit for controlling the supply of alternating current to a load, showing the circuit connected in series with a load 2 across an ac supply 1; and and FIG. 2 is a schematic block circuit diagram showing an optional addition to the circuit of FIG. 1.

The switching circuit includes two thyristors 3 and 4, connected in parallel with opposite polarities. A resistor 5 and a capacitor 6 are connected in parallel between the cathode and the trigger electrode of the thyristor 3. Similarly a resistor 7 and a capacitor 8 are connected in parallel between the trigger electrode and the cathode of the thyristor 4. A first direct voltage supply DCV1 has its negative terminal, connected to the cathode of thyristor 3 and to one terminal of the ac supply 1. The positive terminal of the direct voltage supply DCV1 is connected through the emitter-to-collector path of a transistor 10 and a resistor 9 in series to the trigger electrode of thyristor 3. A second direct voltage supply DCV2 similarly has its negative terminal connected to the cathode of thyristor 4 and one terminal of the load 2, and has its positive terminal connected through a transistor 12 and a resistor 11 to the trigger connection of thyristor 4.

The base of the transistor 10 is connected to the collector of a photo-transistor forming part of an opto-electronic isolator device 13. The collector of the photo-transistor is connected through a resistor 14 to the positive terminal of the first direct voltage supply DCV1 and its emitter is connected to the cathode of thyristor 3. Similarly the base of the transistor 12 is connected to the collector of a photo-tansistor forming path of an opto-electronic isolator device 15; the collector of this photo-transistor is connected via a resistor 16 to the positive terminal of the second direct voltage supply DCV2, and its emitter is connected to the cathode of thyristor 4 and to the load 2. A bridge rectifier circuit comprising diodes 17, 18, 19 and 20 has input terminals connected in parallel with the thyristors 3 and 4. The cathode terminals of diodes 17 and 18 are connected via a resistor 21 to the base of a transistor 22. The anode terminals of diodes 19 and 20 are connected by a zener diode 23 and a resistor 24 in parallel to the base of the transistor 22. The anode terminals of diodes 19 and 20 are also connected to the emitter of a transistor 27 and the negative terminal of a third direct voltage supply DCV3, and are connected by a resistor 28 to the collector of transistor 22. The collector of transistor 22 is connected by a resistor 26 to the base of transistor 27. The third direct voltage supply DCV3 is connected to supply the photo-transistor of a third opto-electronic isolator 25 and a transistor 32 which is controlled by the isolator 25 and is connected in series with the emitter of transistor 22. The third opto-electronic isolator device 25 has control inputs 29 and 30. The emitter of transistors 22 and the collector of transistor 27 are connected to the control inputs of the first and second opto-electronic isolators 13 and 15.

When this circuit is in use but with no control signal applied to the terminals 29 and 30, the transistors 32, 22, 27, 10 and 12 will all be non-conducting and hence no triggering voltage will be applied to the thyristors 3 and 4. When it is desired to apply the alternating supply 1 to the load 2 the control signal is applied to the terminals 29 and 30 which activates the opto-electronic isolator device 25 and the transistor 32 applying the direct current voltage supply DCV3 to the transistor 22. Transistor 22 will not conduct until the full wave rectified supply waveform from the bridge rectifier circuit next falls to zero, but then it causes the transistor 27 to conduct, energising the light emitting diodes of the opto-electronic devices 13 and 15. The opto-electronic isolator devices 13 and 15 then cause the transistors 10 and 12 to conduct, thereby connecting the first and second direct voltage supplies DCV1 and DCV2 to the trigger electrodes of the thyristors 3 and 4. This happens as the alternating supply voltage passes through zero and will apply a rising voltage to the anode of one of the thyristors 3 and 4. This thyristor will then start conducting immediately since it will be receiving trigger voltage from the transistor 10 or 12. It will cease conducting when the current drawn through it decreases to zero, after approximately one half-cycle depending on the power factor of the load; when it ceases, the other thyristor will start conducting immediately. Thereafter the two thyristors 3 and 4 will conduct alternate half-cycles of the current drawn by the load 2, changing from the active to the passive state whenever the load current waveform passes through zero. When either of the thyristors 3 and 4 is conducting it short-circuits the bridge rectifier circuit so that the signal applied to the base of the transistor 22 becomes substantially zero, thus allowing the output from transistor 32 to maintain the transistor 22 in its conducting state as long as the control signal is maintained on the control input terminals 29 and 30 of the opto-electronic isolator device 25.

When it is desired to switch off the supply to the load the control signal is removed from the terminals 29 and 30, which makes the transistors 32, 22 and 27 stop conducting, thereby causing the opto-electronic isolator devices 13 and 15 to stop the supply of trigger voltage to the thyristors 3 and 4. Whichever of the two thyristors 3 and 4 is conducting at the instant when the control signal is removed, it will continue to conduct until the half-cycle of current which it is conducting is completed; when the load current reaches zero at the end of this half-cycle both thyristors will become and remain non-conductive until the control signal is restored.

It will be appreciated that three separate direct voltage supplies are required for this circuit, comprising the first and second direct current trigger voltage supplies DCV1 and DCV2 which are of equal magnitude but necssarily isolated from each other; and the direct voltage supply DCV3 for energising the opto-electronic isolator device 25. The direct voltage supply DCV3 could be derived from the residual voltage across the thyristors when conducting as described with reference to FIG. 1 in U.K. Pat. No. 1,388,437. However since there are two other direct voltage supplies to be provided, it is probably easier to provide a transformer connected across the alternating supply 1 and having three separate secondary windings connected to feed separate rectifier circuits and thus provide the required direct voltage supplies. Conventional rectifier circuits may be used.

If one of the thyristors 3 or 4 in the switching circuit should fail and go open-circuit whilst the switching circuit is supplying the load 2, then the load 2 will be subjected to an unsmoothed half-wave rectified waveform which in some applications, for example with the inductive loads, may cause damage. However if this happens the voltage across the bridge rectifier circuit will rise during alternate half-cycles, and can be used to operate an optional protection circuit for instance as shown in FIG. 2.

FIG. 2 shows schematically a third opto-electronic isolator 33 similar to the isolators 13 and 15 of FIG. 1 and having its control circuit connected to the emitter of transistor 22 and the collector of transistor 27 in FIG. 1. Outputs from the isolator 33 and an overload current detector 34 are applied through an OR-gate 35 to the resetting input of an edge-triggering bistable circuit 36. The master control input for the whole switching circuit is applied to the setting input of this bistable 36; set outputs of the bistable circuit 36 are connected to energise the control inputs 29, 30 of FIG. 1.

Clearly the application of a master control signal to the bistable circuit 36 causes it to switch on the circuit of FIG. 1 and energise the load 2 as hereinbefore described. However, if one of the thyristors 3 or 4 should then fail and go open-circuit the rising voltage across the faulty thyristor will cause the bistable circuit 36 to be reset, thereby switching off the supply.

Many modifications to the embodiments will now suggest themselves to persons skilled in the art. For example it is possible to replace the two thyristors by a single triac device. Also, if opto-electronic isolators of higher power-handling capability become available the transistors 32, 10 and 22 may become unnecessary as the isolator output may be used directly instead. In the circuit of FIG. 1 the photo-transistor of the isolator 25 and transistor 32 are connnected in an emitter-follower configuration, which requires the resistor 31 to be included. However these circuits could alternatively be connected in a grounded-emitter configuration similar to that of the devices 13 and 15 and the transistor 10 and 12 which they control. This configuration would avoid the need for resistor 31.

I claim:

1. An electronic switching circuit for controlling a supply of alternating current electricity to a load, including a bi-directional rectifier combination comprising first and second thyristors connected in parallel with opposite polarities, each thyristor having a trigger elecrtrode; first and second direct current trigger voltage supplies of equal magnitude and polarity but electrically isolated from each other; a first switchable semiconductor device connected in series between the first direct current trigger voltage supply and the trigger electrode of the first thyristor; a second switchable semiconductor device, connected in series between the second direct current trigger voltage supply and the trigger electrode of the second thyristor; control means for rendering both first and second switchable semiconductor devices conductive simultaneously from the next zero voltage instant of the alternating current supply after the onset of a control signal; detection means for detecting when either of the thyristors has failed open-circuit; and inhibiting means controlled by the detection means for inhibiting the control signal whenever an open-circuit failure of either of the thyristors is detected by the detection means.

2. An electronic switching circuit as claimed in claim 1 and wherein the first and second switchable semiconductor devices are photo-transistors of first and second opto-electronic isolator devices respectively.

3. An electronic switching circuit as claimed in claim 9 and wherein the first and second switchable semiconductor devices are first and second transistors respectively and the control means includes a first opto-electronic isolator device connected to control the switching operations of the said first transistor and a second opto-electronic isolator device connected to control the switching operations of the second transistor.

4. An electronic switching circuit as claimed in claim 1 and wherein the control means includes a full-wave rectifier circuit connected in parallel with the said thyristors, and a third switchable semiconductor device connected to receive a control signal on one input and the unsmoothed output waveform of the full-wave rectifier circuit on another input so that it will conduct only when the control signal is on and the rectifier output is substantially at zero voltage and means for rendering the said first and second switchable semiconductor devices conductive in response to the conduction of the third switchable semiconductor device.

5. An electronic switching circuit as claimed in claim 4 and wherein the control means also comprises a third direct voltage supply and a third opto-electronic isolator device connected to control the supply of a direct voltage from the third direct voltage supply to the third switchable semiconductor device as a control signal.

6. An electronic switching circuit as claimed in claim 4 wherein the detection means comprises a fourth opto-electronic isolator device responsive to the output waveform developed across the full-wave rectifier circuit when either of the thyristors fails open-circuit, and wherein the inhibiting means comprises an edge-triggering bistable circuit having a setting input connected to receive the control signal, a resetting input connected to the output of the fourth opto-electronic isolator device, and a set output connected to control the said third opto-electronic isolator device.

* * * * *

UNITED STATES PATENT OFFICE
CERTIFICATE OF CORRECTION

Patent No. 4,021,683    Dated May 3, 1977

Inventor(s) Reginald John Kingston Splatt

It is certified that error appears in the above-identified patent and that said Letters Patent are hereby corrected as shown below:

In Column 6, line 23, the claim reference numeral "9" should read -- 1 --.

Signed and Sealed this sixteenth Day of August 1977

[SEAL]

Attest:

RUTH C. MASON
Attesting Officer

C. MARSHALL DANN
Commissioner of Patents and Trademarks